United States Patent [19]
Takemura

[11] Patent Number: 5,587,326
[45] Date of Patent: Dec. 24, 1996

[54] METHOD OF FORMING BIPOLAR JUNCTION TRANSISTOR OF EPITAXIAL PLANAR TYPE

[75] Inventor: Hisashi Takemura, Tokyo, Japan

[73] Assignee: NEC Corporation, Tokyo, Japan

[21] Appl. No.: 965,027

[22] Filed: Oct. 23, 1992

[30] Foreign Application Priority Data

Oct. 24, 1991 [JP] Japan ............... 3-277623

[51] Int. Cl.$^6$ ............................... H01L 21/265
[52] U.S. Cl. ............... 437/31; 437/33; 437/162; 437/191; 437/193; 437/909; 148/DIG. 10; 148/DIG. 11; 148/DIG. 35; 148/DIG. 124; 257/565; 257/586
[58] Field of Search .................. 437/31, 233, 162, 437/193, 33, 909, 191; 148/DIG. 10, DIG. 11, 35, 124; 257/586, 565

[56] References Cited

U.S. PATENT DOCUMENTS

| | | | |
|---|---|---|---|
| 4,194,934 | 3/1980 | Blaske et al. | 437/233 |
| 4,332,837 | 6/1982 | Peyre-Lavigne | 437/233 |
| 4,358,326 | 11/1982 | Doo | 437/233 |
| 4,433,469 | 2/1984 | Goodman | 437/233 |
| 4,814,291 | 3/1989 | Kim et al. | 437/233 |
| 4,975,381 | 12/1990 | Taka et al. | 437/162 |
| 5,010,026 | 4/1991 | Gomi | 437/162 |
| 5,116,770 | 5/1992 | Kameyama et al. | 148/DIG. 10 |
| 5,147,826 | 9/1992 | Liu et al. | 437/233 |
| 5,254,485 | 10/1993 | Segawa et al. | 148/DIG. 10 |
| 5,268,313 | 12/1993 | Mass et al. | 148/DIG. 10 |

FOREIGN PATENT DOCUMENTS

| | | |
|---|---|---|
| 8199564 | 11/1983 | Japan . |
| 0036926 | 2/1984 | Japan ............ 437/233 |
| 0193520 | 8/1988 | Japan ............ 437/233 |

Primary Examiner—Olik Chaudhuri
Assistant Examiner—Long Pham
Attorney, Agent, or Firm—Burns, Doane, Swecker & Mathis

[57] ABSTRACT

In a bipolar junction transistor of an epitaxial planar type comprising a base region, an emitter region formed in the base region, and a poly-silicon layer as an emitter poly-silicon electrode layer overlying the emitter region, the poly-silicon layer being used as an impurity diffusion source for forming the emitter region in fabrication of the transistor, the emitter poly-silicon electrode layer comprises a poly-silicon film containing an additive of one of C, O, and P overlying the emitter region and a poly-silicon layer overlying the poly-silicon film. An impurity is doped in the poly-silicon layer and is diffused into the base region through the poly-silicon film to form the emitter region in the base region in fabrication of the transistor. The poly-silicon film contains the additive and serves to prevent the poly-silicon film and the poly-silicon layer from grain growth which badly affects the impurity diffusion for forming the emitter region.

9 Claims, 6 Drawing Sheets

FIG. 2(a)
PRIOR ART
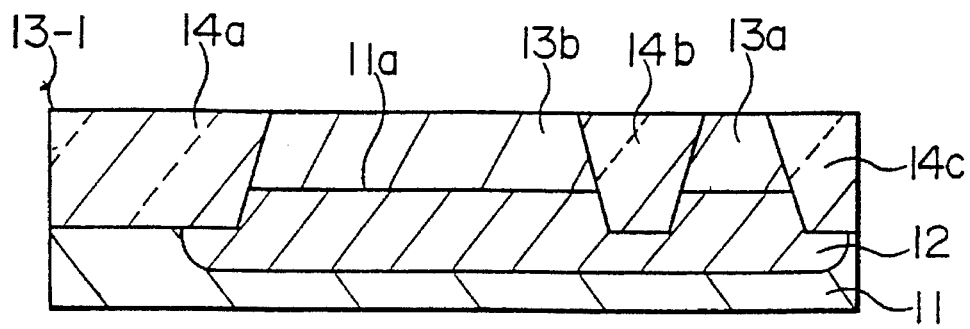
FIG. 2(b)
PRIOR ART
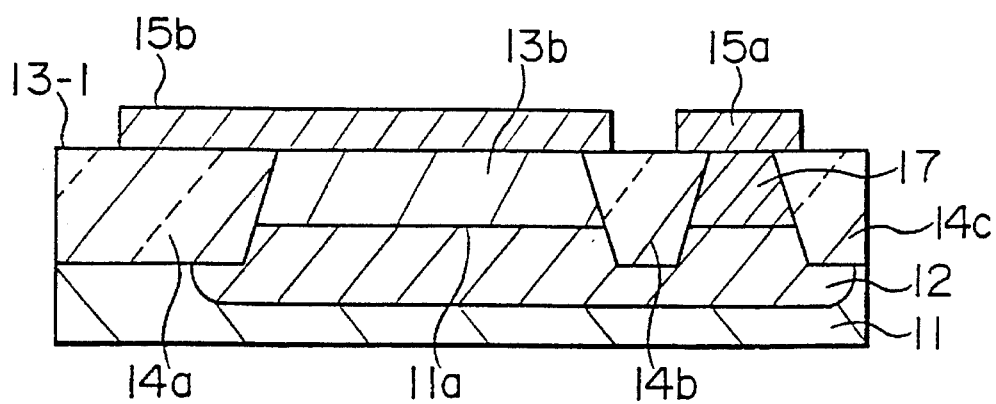
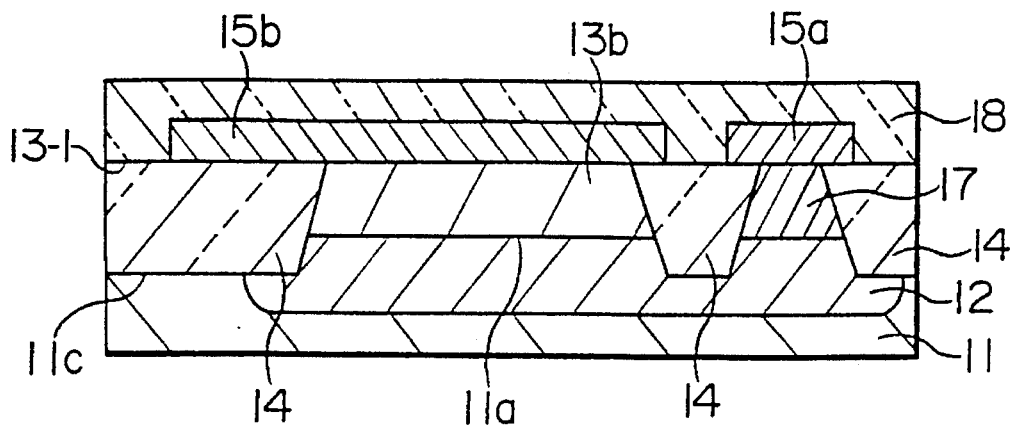
FIG. 2(c)
PRIOR ART

FIG. 2(f)
PRIOR ART
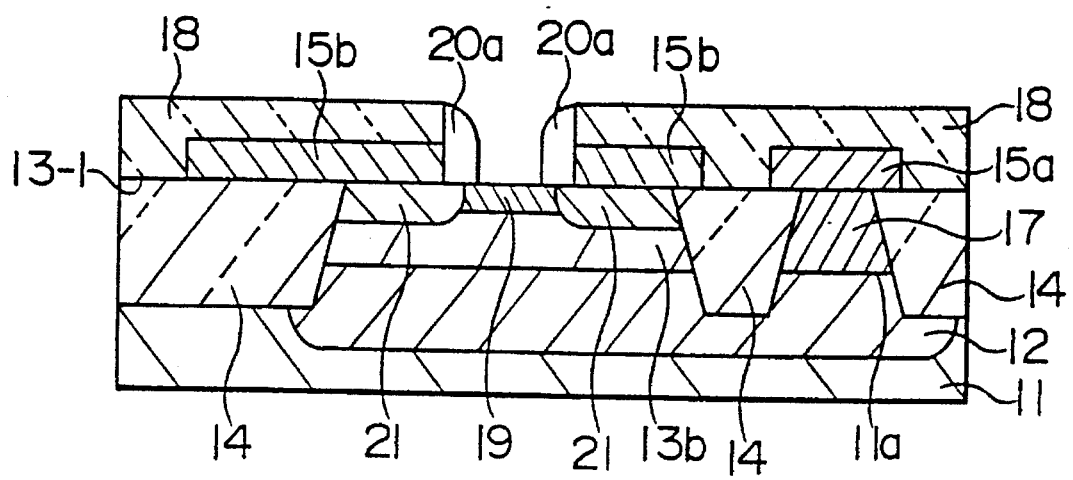
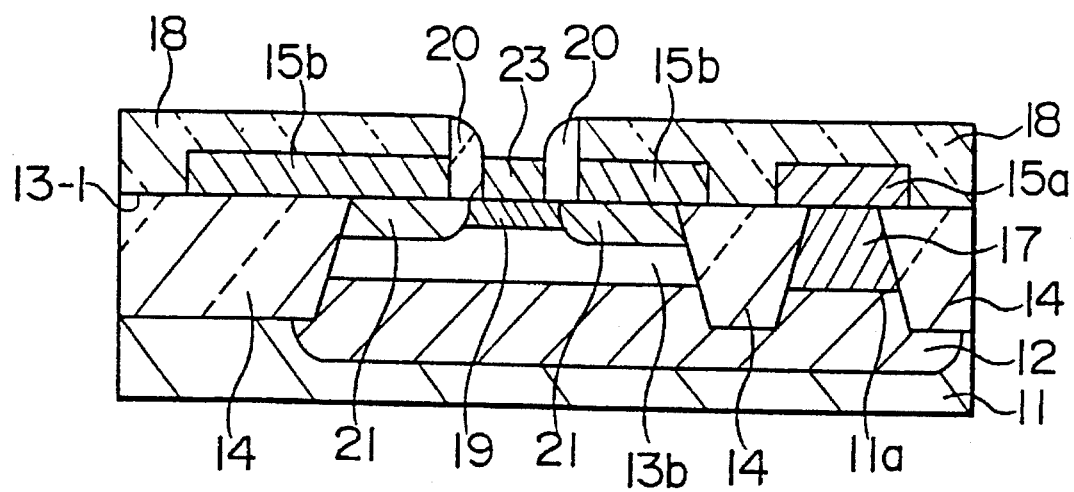
FIG. 2(g)
PRIOR ART

METHOD OF FORMING BIPOLAR JUNCTION TRANSISTOR OF EPITAXIAL PLANAR TYPE

BACKGROUND OF THE INVENTION

This invention relates to a semiconductor device and, in particular, to a bipolar junction transistor of an epitaxial planar type and fabrication processing method thereof.

In the manner which will later be described more in detail, a conventional bipolar junction transistor of an epitaxial planar type comprises a collector region of a first conductivity type formed in a semiconductor substrate, a base region of a second conductivity type formed on the collector region, and an emitter region of the first conductivity type formed in the base region. An insulating layer is formed on the base region and the emitter region. The insulating layer has an opening in registry with the emitter region to form an emitter contact hole for a poly-silicon electrode. In the emitter contact hole, a poly-silicon layer is formed to be contact with a top surface of the emitter region. The poly-silicon layer is connected to an aluminum electrode formed on the emitter layer.

In fabrication of the transistor described above, the emitter region is formed after formation of the insulating layer and the poly-silicon layer. An impurity of the first conductivity type is doped in the poly-silicon layer by, for example, the ion implantation method. Thus, the impurity is diffused into the base region from the poly-silicon layer by the thermal diffusion method to form the emitter region of the first conductivity type in the base region.

It should be noted that before forming the poly-silicon in the emitter contact hole, the exposure surface of the base region is exposed to the atmosphere and is partially oxidized naturally. That is, the exposed surface is partially covered with the native oxide.

When the poly-silicon is formed on the base region partially coated with the native oxide, the poly-silicon grains tend to grow on a monocrystal surface of the base region and the native oxide less than 10 angstroms in thickness.

On the other hand, it is noted in the thermal diffusion of impurity from the poly-silicon into the base region that the diffusion speed is larger in the crystal grain boundary than in the crystal grain. This means that the grain growth of the poly-silicon makes the diffusion speed slow, so that the time is extended for the thermal diffusion of the impurities to form the emitter region in the base region. This also results in expansion of the base region which degrades the transistor properties such as the cut-off frequency f(T).

SUMMARY OF THE INVENTION

It is therefore an object of the present invention to provide a bipolar junction transistor of an epitaxial planar type and fabrication processing method thereof possible to prevent the transistor properties from degrading.

Other objects of this invention will become clear as the description proceeds.

According to this invention, there is provided a bipolar junction transistor of an epitaxial planar type comprising a semiconductor substrate with a primary surface, a collector region of a first conductivity type formed in the primary surface of the semiconductor substrate, a base region of a second conductivity type overlying the collector region, the base region having a base exposure surface, an emitter region of the first conductivity type formed in the base exposure surface, the emitter region having an emitter exposure surface in the base exposure surface, an insulating layer overlying the base exposure surface and the emitter exposure surface and having an opening in registry with the emitter region to form an emitter contact hole for a poly-silicon electrode, and an emitter poly-silicon electrode layer formed in the emitter contact hole, the emitter poly-silicon electrode layer comprising a conductor film formed on the emitter exposure layer and a poly-silicon layer formed on the conductor film, the conductor film having a function for preventing poly-silicon from grain growth.

Furthermore, there is provided a fabrication method of a bipolar junction transistor of an epitaxial planar type comprising a first step of preparing a semiconductor substrate with a primary surface, a second step of forming a collector region of a first conductivity type in the primary surface of the semiconductor substrate, a third step of forming a base region of a second conductivity type on the collector region, the base region having a base exposure surface, a fourth step of forming an insulation layer overlying the base region, the insulating layer having an opening in registry with a predetermined surface portion of the base exposure surface, a fifth step of forming a conductor film on the predetermined surface portion in the opening, the conductor film having a function for preventing poly-silicon from grain growth, a sixth step of forming a poly-silicon layer overlying the conductive film, and a seventh step of forming an emitter region of a first conductivity type in the predetermined surface portion of the base exposure surface, the conductive film and the poly-silicon serving as an emitter poly-silicon electrode layer.

BRIEF DESCRIPTION OF THE DRAWING

FIGS. 2(a) to 2(g) are cross sectional views for explaining a fabrication method of a bipolar junction transistor of an epitaxial planar type in general;

DESCRIPTION OF THE PREFERRED EMBODIMENT

Referring to FIG. 1 and FIGS. 2(a) to 2(g), a structure and a fabrication method of a conventional bipolar junction transistor of an epitaxial planar type will first be described in order to facilitate an understanding of the present invention.

Figure 1:
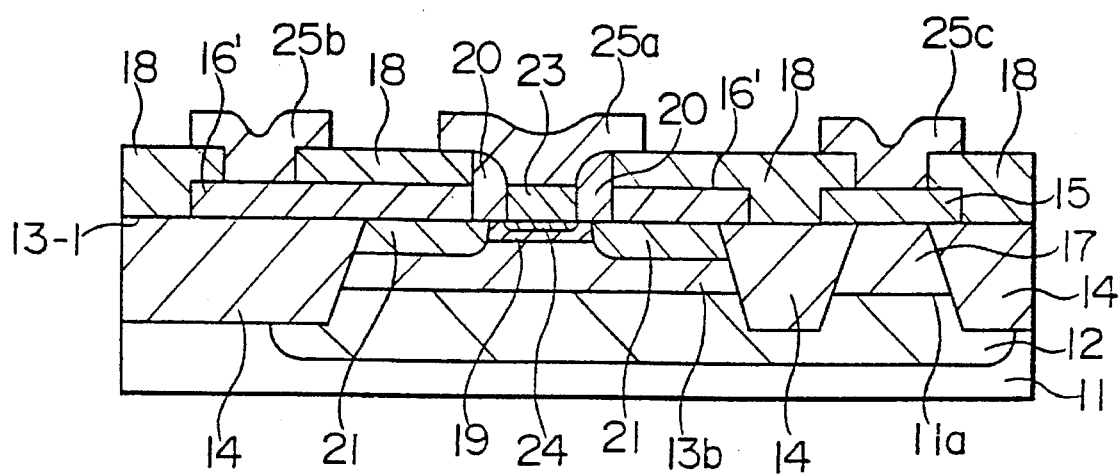
FIG. 1 is a cross sectional view of a convention bipolar junction transistor of an epitaxial planar type.

The conventional bipolar junction transistor of the epitaxial planar type which is shown in FIG. 1 is formed by the use of the following steps indicated in FIGS. 2(a) to 2(g).

Step 1

Referring now to FIG. 2(a), a P-type Si semiconductor substrate 11 is prepared for giving a foundation of the bipolar junction transistor of an NPN type. The P-type Si substrate 11 has an upper side surface or a primary surface 11a. An $N^+$-buried layer 12 is formed in a predetermined region thereof under the primary surface 11a by the use of a selective diffusion of an N-type impurity such as arsenic (As) in concentration of $10^{19}$ per one $cm^3$. "$N^+$" means that the N-type impurity is relatively heavily doped.

Next, an epitaxial growth layer 13 with a top surface 13-1 is formed in thickness of approximately one micron under the primary surface 11a. The epitaxial growth layer 13 is doped by an N-type impurity such as phosphorus (P) in concentration of $10^{16}$ to $10^{17}$ per one $cm^3$ in the epitaxial growth.

Thereafter, isolating islands of $SiO_2$ 14a, 14b, and 14c are selectively formed in the epitaxial growth layer 13. As a result, the epitaxial growth layer 13 is separated into portions 13a and 13b which are formed to be isolated with each other. In addition, the isolating islands of $SiO_2$ 14a, 14b, and 14c are formed in and on the primary surface 11a. The isolating island 14b serves as insulation between a base and a collector regions of the transistor, as will later be described.

Step 2

Referring to FIG. 2(b), a poly-silicon film 15 in thickness of 2,500 angstroms is formed on the primary surface 11a by the use of CVD (chemical vapor deposition) method. The poly-silicon film 15 is selectively etched by the use of a usual photolithography technique and then is subjected to selective diffusion of phosphorus by the use of a nitride layer (not shown) as a masking pattern. As a result, a pair of doped and non-doped poly-silicon layers 15a and 15b are formed. The doped poly-silicon layer 15a is an N-type poly-silicon layer containing an N-type impurity such as a phosphorus (P) in concentration of approximately $10^{19}$ per one $cm^3$. Then, the N-type impurity is diffused from the doped poly-silicon layer 15a into the epitaxial growth layer portion 13a to form an $n^+$ region 17 for a collector contact 17. Then, a P-type impurity such as boron is doped into the non-doped poly-silicon layer 15b by the ion implantation technique with an energy of 30 eV and a dose of from $1\times10^{15}$ per one $cm^2$ to $1\times10^{16}$ per one $cm^2$, so that the non-doped poly-silicon layer 15b is converted into a P-type poly-silicon film.

Step 3

Referring to FIG. 2(c), an insulating layer 18 in thickness of about 3,000 angstroms is formed to coat on the top surface 13-1 and the N-type and P-type poly-silicon layers 15a and 15b. The insulating layer 18 may be a planar multi-structure with a BPSG (borophosphosilicate glass) layer, a painted silica layer, an oxidation layer, a nitride layer etc.

Step 4

Figure 2D:
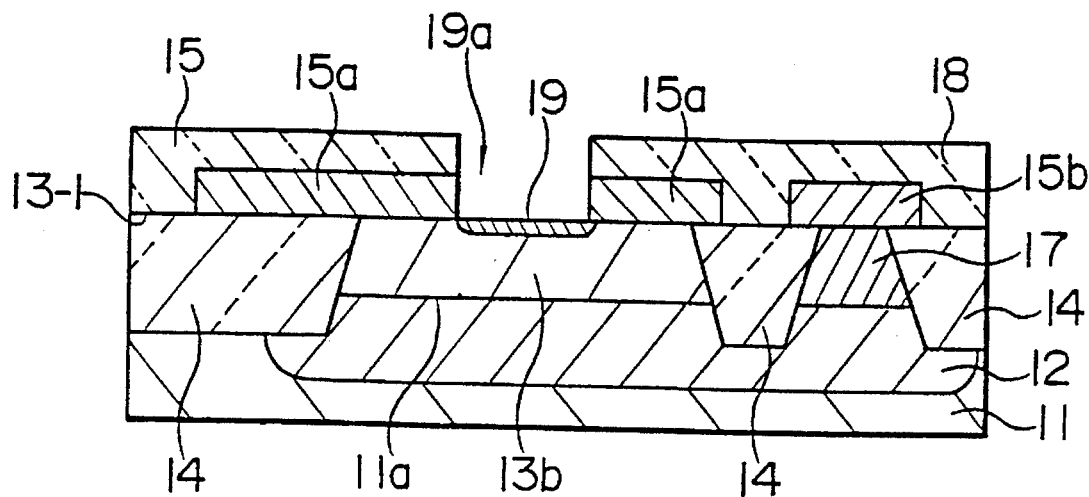

Referring to FIG. 2(d), an opening 19a for forming the base region is selectively etched in a predetermined area of the insulating layer 18 and the P-type poly-silicon layer 15b. A boron is doped into the epitaxial grown layer 13b through the opening 19a according to the ion implantation technique with a dosage of from $1\times10^{13}$ per one $cm^2$, so that a boron region 19 is formed as a base region.

Step 5

Figure 2E:
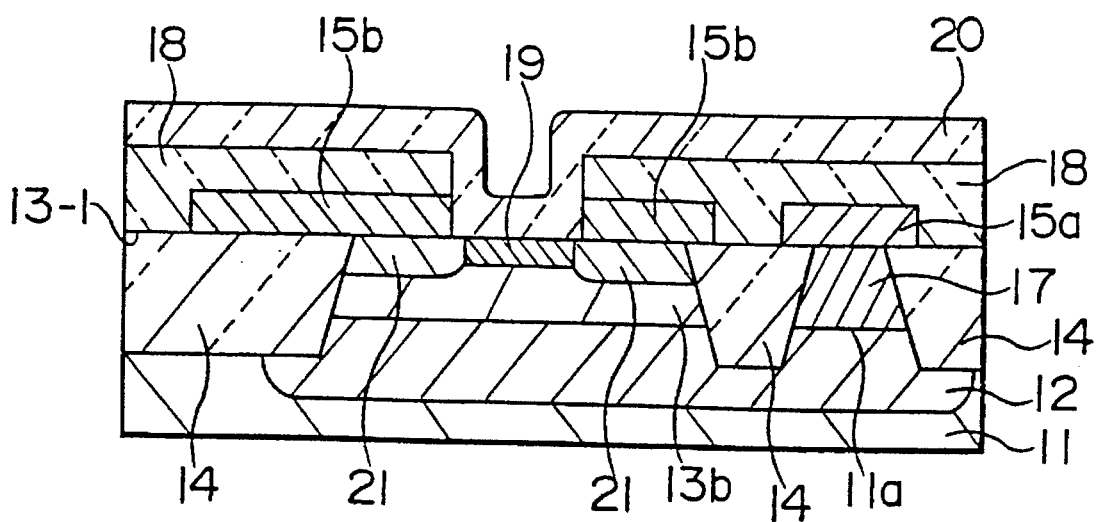

Referring to FIG. 2(e), an insulating layer of $SiO_2$ 20 of thickness of 2000 angstroms is then formed onto the surface of the boron region 19 and the insulating layer 18. Then, the boron atoms are diffused from the P-type poly-silicon layer 15b into the epitaxial growth layer 13b in concentration of $10^{19}$ to $10^{20}$ per one $cm^3$ by the use of a thermal diffusion method in a nitrogen $N^2$ atmosphere. As a result, a extrinsic base region 21 is formed in the epitaxial growth layer 13b. At the time, boron in the boron region 19 is excited so that the boron region 19 becomes the base region.

Step 6

Referring to FIG. 2(f), the insulating layer 20 is partially removed on the insulating layer 18 by the use of an anisotropic etching technique, so that only a side-wall portion 20a is left on the inner surface of the opening 19a.

Step 7

Referring to FIG. 2(g), a poly-silicon layer 23 is formed so as to be in the same thickness of the P-type poly-silicon layer 15b. Then, arsenic (As) ions are implanted into the poly-silicon layer 23 and the thermal diffusion is carried out to diffuse the arsenic ions into the base region 19 from the poly-silicon layer 23. As a result, the emitter region layer 24 is formed under the top surface 13-1 into the base region 19 as shown in FIG. 1.

A subsequent step is of fabricating suitably contact holes in the insulating layer 18. Thereafter, three aluminum electrodes 25a, 25b, and 25c are selectively formed in the opening 19a and the contact holes, the transistor is fabricated as shown in FIG. 1.

The conventional transistor described above has problems which has been described in the preamble.

Figure 3:
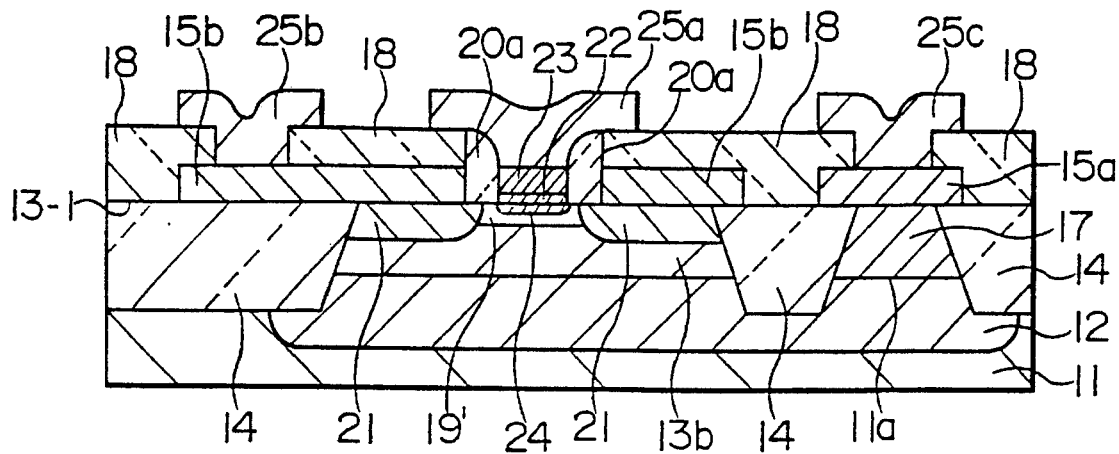
FIG. 3 is a cross sectional view of a bipolar junction transistor of an epitaxial planar type according to a preferred embodiment of this invention.

Referring to FIG. 3, a bipolar junction transistor of an epitaxial planar type according to a preferred embodiment of this invention is similar to the conventional transistor of FIG. 1 except for a conductor film 22 having a function for preventing poly-silicon from grain growth. The conductive film is preferably a poly-silicon film containing an atom such as C, O, P.

A fabrication method of the transistor of FIG. 3 comprises steps similar to steps 1–6 described above in conjunction with FIGS. 2(a)–2(f), and a different step 7A subsequent to step 6 (FIG. 2(f)).

Figure 4:
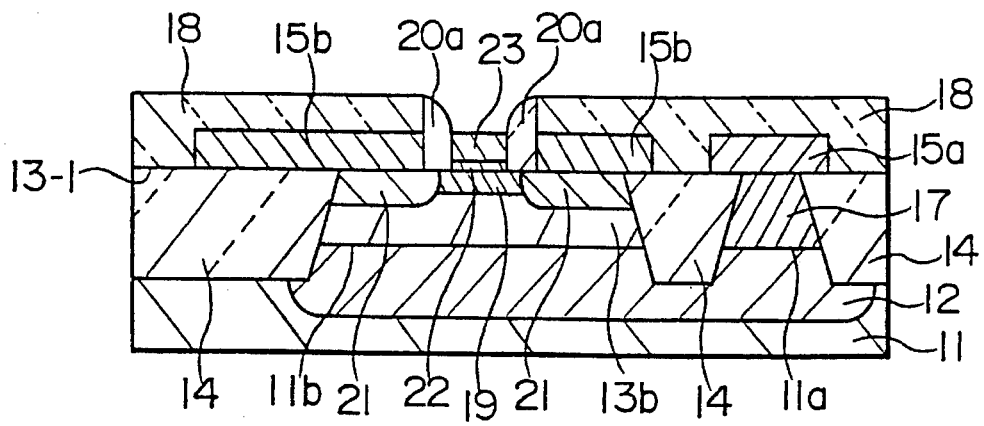
FIG. 4 is a cross section view for illustrating in a fabrication method of a bipolar junction transistor of an epitaxial planar type according to a preferred embodiment of this invention.

In FIGS. 3 and 4, similar parts are identified by the same reference marks in FIGS. 1–2(g).

Referring now to FIG. 4, the step 7A will be described below.

As shown in FIG. 2(f) in step 6, the insulating layer 20 is removed but is partially left, as the sidewall portion 20a, on the inner surface of the hole 19a.

Step 7A

Referring to FIG. 4, this step is of forming a conductive film 22 having a function for preventing poly-silicon from grain growth in use of the CVD method for forming a poly-silicon layer 23 hereinafter.

In order to form the conductive film 22, a chemical vapor deposition is carried out in a chamber for a CVD apparatus at pressure of 10 Torr, 800 Celsius degrees by leading into the chamber a mixing gas under the conditions by mixing an HCl gas flow with a feed gas which is composed of an $H_2$ gas flow of 10 litters, of an $SiH_2Cl_2$ flow of 10 cc per one minute, and of $C_2H_6$ flow of 10 cc per one minute.

The conductive film 22 is produced on the top surface 13-1 as a poly-silicon film containing an additive of a predetermined atom carbon (C). It is necessary for the conductive film 22 to be formed in thickness of 100 angstroms or less.

Then, in order to form the poly-silicon layer 23, an atmosphere is led into the chamber by mixing the $H_2$ gas flow and the SiH$_2$Cl$_2$ gas flow with the HCl gas flow and a further CVD is carried out at 800 Celsius degrees. The poly-silicon layer 23 is formed in thickness of about 2,000 angstroms. The conductor film 22 and the poly-silicon layer 23 serve as the emitter poly-silicon electrode layer.

Then, arsenic (As) ions are implanted into the poly-silicon layer 23 by the ion implantation technique with an energy of such as 70 KeV at a dose of 1×10$^{16}$ per one cm$^2$. Then, the thermal diffusion is carried out by heat treatment at the condition of, for example, 900 Celsius degrees for 10–30 minutes or 1000 Celsius degrees for 10–30 seconds. Thus, the arsenic ions diffuses in the poly-silicon layer 23 and into the base region 19 through the conductive film 22 to form the emitter region 24 in the base region 19.

Thereafter, the electrodes 25a, 25b, and 25c are formed in the manner similar to the conventional method. Thus, the transistor of FIG. 3 is produced.

It should be noted that the conductive film 22 of thickness larger than 100 angstroms causes to increase an emitter resistance thereof, because a resistance of the poly-silicon conductive film 22 containing C is greater than that of the conventional poly-silicon free of carbon.

The additive in the poly-silicon conductive film 22 may be oxygen (O) instead of carbon (C). The conductive film 22 is formed in thickness of 20 to 100 angstroms.

The poly-silicon conductive film 22 containing O is formed at a pressure of 30 Torr in CVD chamber supplied with HCl gas together with the mixed gas containing SiH$_2$Cl$_2$, H$_2$, and O$_2$.

As the additive in the poly-silicon conductive film 22, phosphorus (P) may be used instead of the carbon (C). In use of phosphorus, the CVD method is carried out at a pressure of 30 Torrs by supply of HCl gas together with a mixed gas containing SiH$_2$Cl$_2$, and PH$_3$.

The use of phosphorus has an advantage of preventing a resistance thereof from increasing, because the additive of phosphorus (P) becomes an N-type impurity.

Figure 5:
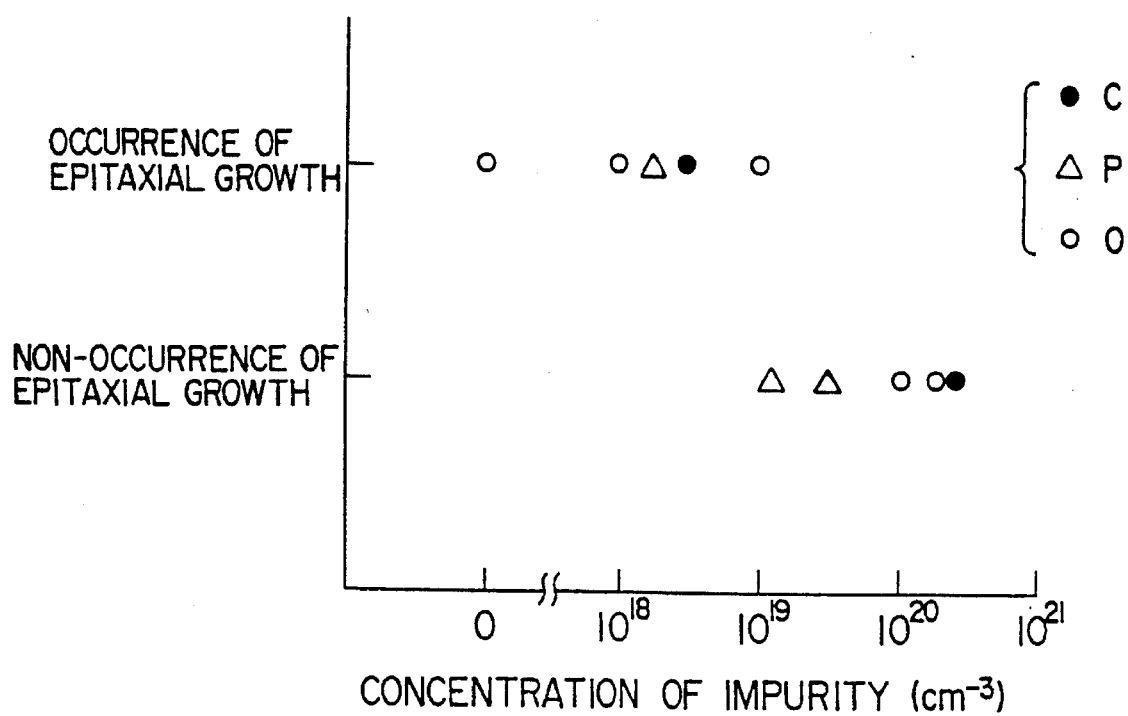
FIG. 5 is a graph showing a relation of occurrence of an epitaxial grain growth in the poly-silicon layer for each concentration of the additive such as C, P, and O.

FIG. 5 shows measured data of a relation of epitaxial grain growth occurrence in the poly-silicon layer in response to each concentration of additives such as carbon (C), phosphorus (P), and oxygen (O).

As a result, a low concentration thereof causes occurrence of the epitaxial grain growth in the poly-silicon layer. On the other hand, a high concentration thereof prevents the poly-silicon layer 23 from an epitaxial grain growth.

Figure 6:
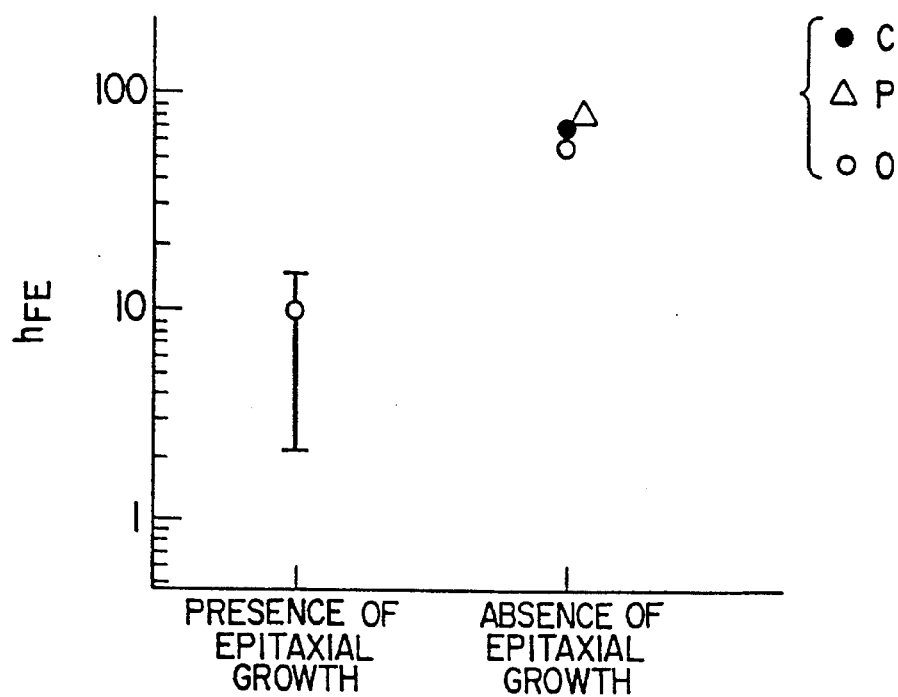
FIG. 6 is a graph for showing a change of each current gain $h_{FE}$ of a transistor depending on presence and absence of an epitaxial grain growth.

FIG. 6 shows measures data of a relation of a current gain h$_{FE}$ of the transistor depending on presence or absence of the epitaxial grain growth in the poly-silicon layer. The transistor measured has an aluminum electrodes 25a of an emitter contact of a width of 0.4 micron and length of 1.6 micron. A value of the current gain h$_{FE}$ thereof becomes 20 or lower in presence of the epitaxial grain growth, but becomes from 70 to 80 in absence of the epitaxial grain growth.

While this invention has thus far been described in specific conjunction with an NPN bipolar junction transistor of an epitaxial planar type according to a preferred embodiment thereof, it will now be readily possible for one skilled in the art to put this invention into practice in various other manners. For example, a PNP junction transistor of an epitaxial planar type may be adapted for this invention.

What is claimed is:

1. A fabrication method of a bipolar junction transistor of an epitaxial planar type comprising:

a first step of preparing a semiconductor substrate with a primary surface;

a second step of forming a collector region of a first conductivity type in the primary surface of said semiconductor substrate;

a third step of forming a base region of a second conductivity type on said collector region, said base region having a base exposure surface;

a fourth step of forming an insulating layer overlying said base region, said insulating layer having an opening in registry with a predetermined surface portion of said base exposure surface;

a fifth step of forming a conductor film on said predetermined surface in said opening, said conductor film including an additive which prevents grain growth of poly-silicon, said additive is selected from a group consisting of C, O and P, and said conductive film has a predetermined thickness not thicker than 100 Å;

a sixth step of forming a poly-silicon layer overlying said conductive film; and a seventh step of forming an emitter region of a first conductivity type in said predetermined surface portion of said base exposure surface, said conductive film and said poly-silicon layer serving as an emitter poly-silicon electrode layer;

said seventh step further comprising the substeps of:
      doping an impurity of the first conductivity type in said poly-silicon layer; and
      thermally diffusing said impurity from said poly-silicon layer into said base region through said conductive film to form said emitter region in said base region.

2. A fabrication method as claimed in claim 1, wherein said fourth step comprises the sub-steps of:

forming an insulating lamina on said base region; and selectively etching said insulating lamina into said insulating layer to define said opening and to leave said insulating layer on said predetermined surface portion defined by said opening, wherein the impurity of said first conductivity type is doped in said poly-silicon layer by an ion implantation technique.

3. A fabrication method of a bipolar junction transistor of an epitaxial planar type, which comprises a collector region of a first conductivity type, a base region of a second conductivity type different from said first conductivity type, and an emitter region of the first conductivity type which is formed through a conductive film deposited on said emitter region and a poly-silicon layer deposited on said conductive film, said fabrication method comprising the steps of:

adding an additive in said conductive film which prevents occurrence of grain growth in the poly-silicon layer, said additive is selected from a group consisting of C, O and P;

depositing the conductive film including said additive, to a predetermined thickness not thicker than 100 Å; and depositing the poly-silicon layer onto said conductive film.

4. A fabrication method as claimed in claim 3, wherein the predetermined thickness is between 20 and 100 angstroms.

5. A fabrication method as claimed in claim 4, wherein said poly-silicon layer has a thickness of about 2000 angstroms.

6. A fabrication method as claimed in claim 3, wherein said conductive film is formed by in-situ doping of said additive.

7. A fabrication method as claimed in claim 1, wherein said fifth step is of forming said conductive film by the chemical vapor deposition with supply of a mixed gas containing $SiH_2Cl_2$, $C_2H_6$, and hydrogen chloride, to thereby form said conductive film containing C.

8. A fabrication method as claimed in claim 1, wherein said fifth step is of forming said conductive film by the chemical vapor deposition with supply of a mixed gas containing $SiH_2Cl_2$, $H_2$, $O_2$, and hydrogen chloride, to thereby form said conductive film containing O.

9. A fabrication method as claimed in claim 1, wherein said fifth step is of forming said conductive film by the chemical vapor deposition with supply of a mixed gas containing $SiH_2Cl_2$, $H_2$, $O_2$, $PH_3$, and hydrogen chloride, to thereby form said conductive film containing P.

* * * * *